United States Patent [19]

Terada

[11] Patent Number: 4,725,983
[45] Date of Patent: Feb. 16, 1988

[54] NONVOLATILE SEMICONDUCTOR MEMORY DEVICE

[75] Inventor: Yasushi Terada, Hyogo, Japan

[73] Assignee: Mitsubishi Denki Kabushiki Kaisha, Tokyo, Japan

[21] Appl. No.: 46,789

[22] Filed: May 7, 1987

[30] Foreign Application Priority Data

May 13, 1986 [JP] Japan .................................. 61-111315

[51] Int. Cl.⁴ ............................................. G11C 11/40
[52] U.S. Cl. .................................... 365/185; 365/104; 365/189
[58] Field of Search ............... 365/182, 185, 189, 104, 365/230

[56] References Cited

U.S. PATENT DOCUMENTS 4,661,833  4/1987  Mizutani ............................. 360/189

OTHER PUBLICATIONS

ISSCC Digest of Technical Papers, Feb. 24, 1983, "Nonvolatile Memory" by Neil J. Becker et al.

Primary Examiner—Terrell W. Fears
Assistant Examiner—Alfonso Garcia
Attorney, Agent, or Firm—Lowe, Price, LeBlanc, Becker & Shur

[57] ABSTRACT

A nonvolatile random access memory comprising a memory cell including a first MOS transistor having a drain connected to a bit line and a gate connected to a word line, a memory transistor having a drain connected to a source of the first MOS transistor, a control gate connected to a first control signal line and a floating gate for storing charges, and a second MOS transistor connected between a source of the memory transistor and a ground potential and connected to a second control signal line. The memory cell operates as a random access memory cell when the first control signal line is an "H" level and the second MOS transistor is turned off in response to and "L" level on the second control signal line, and operates as an EEPROM when the first control signal line is an "L" level and/or a "$V_p$" level.

3 Claims, 6 Drawing Figures

NONVOLATILE SEMICONDUCTOR MEMORY DEVICE

BACKGROUND OF THE INVENTION

1. Field of the Invention

The present invention relates to a nonvolatile semiconductor memory device and more particularly, to a structure of a memory cell in a nonvolatile random access memory device which can be used as a dynamic random access memory and an electrically programmable and erasable memory.

2. Description of the Prior Art

An EEPROM (electrically erasable and programmable read only memory) has been known as an electrically programmable nonvolatile semiconductor memory device. The EEPROM has some disadvantages. For example, it requires a data writing time on the order of the millisecond and has a limitation to the number of times of rewriting data. Therefore, a conventional nonvolatile random access memory device (referred to as a nonvolatile RAM hereinafter) is achieved by a combination of a static RAM memory cell capable of reading and writing data at high speed and an EEPROM memory cell capable of storing information in a nonvolatile manner.

Figure 1:
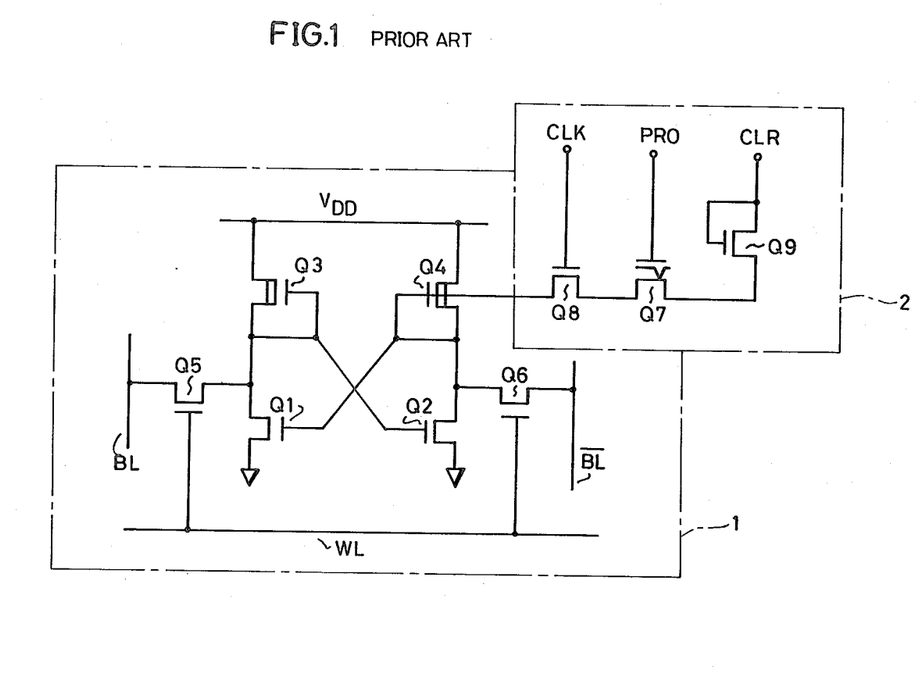
FIG. 1 is a diagram showing a structure of the memory cell in a conventional nonvolatile RAM comprising a static RAM and an EEPROM.

FIG. 1 is a diagram showing an example of a structure of a memory cell in a conventional nonvolatile RAM, which is disclosed in, for example, ISSCC Digest of Technical Papers, Feb., 1983, pp. 170. In FIG. 1, the memory cell in the conventional nonvolatile RAM comprises a static RAM memory cell portion 1 and an EEPROM memory cell portion 2.

The static RAM cell portion 1 comprises a flip-flop including n channel MOS transistors Q1 to Q4 for storing an information, and transfer gates Q5 and Q6 for transferring data from the flip-flop to a pair of bit lines BL and $\overline{BL}$ or vice versa.

The flip-flop comprises the n channel MOS transistors Q1 and Q2 having gates and drains cross-connected to each other, the transistor Q3 of a depletion type having one conduction terminal connected to a power supply $V_{DD}$ and a gate and other conduction terminal each connected to the gate of the MOS transistor Q2, and the MOS transistor Q4 of a depletion type having one conduction terminal connected to the power supply $V_{DD}$ and a gate and other conduction terminal each connected to the gate of the MOS transistor Q1. The transfer gate Q5 has one conduction terminal connected to the bit line BL, other conduction terminal connected to a node of the MOS transistors Q1 and Q3 and a gate connected to a word line WL. The transfer gate Q6 has one conduction terminal connected to the bit line $\overline{BL}$, other conduction terminal connected to a node of the MOS transistors Q2 and Q4 and a gate connected to the word line WL.

The EEPROM memory cell portion 2 comprises a transfer gate Q8 for transferring data from/to the static RAM cell portion 1, a transistor Q7 of an FLOTOX (Floating Gate Tunnel Oxide Film) type for storing information in a nonvolatile manner, and a transistor Q9 serving as a source for transferring charges from/to a floating gate of the memory transistor Q7. The transfer gate transistor Q8 has a gate receiving a clock signal CLK for providing timing for transferring data from the static RAM cell portion 1 to the EEPROM cell portion 2 or vice versa. The memory transistor Q7 has a control gate receiving a signal PRO for providing timing for writing and erasing information of the memory transistor Q7. The transistor Q9, which has a diode-connection, has one conduction terminal connected to a drain of the memory transistor Q7 and other conduction terminal connected to a signal CLR for applying potential to the drain of the memory transistor Q7 when data is written and erased. Description is now made on operation.

A memory cell is selected by the word line WL. More specifically, when the potential on the selected word line WL becomes an "H" level, the transfer gates Q5 and Q6 are turned on. As a result, outputs of the flip-flop, i.e. the drains of the transistors Q1 and Q2 are connected to the bit lines BL and $\overline{BL}$, respectively, so that information is read or written through the bit lines BL and $\overline{BL}$.

Information is stored in a nonvolatile manner in the EEPROM cell portion 2, that is, in the memory transistor Q7 through the transfer gate Q8. Operation of writing, erasing and reading data in the memory transistor Q7 are the same as that in the conventional memory transistor in an EEPROM. More specifically, data written into the static RAM cell portion 1 is stored in a nonvolatile manner through the transistors Q8 and Q9 by making the signals CLK, PRO and CLR and the power supply potential $V_{DD}$ of the memory cell a suitable voltage at suitable timing. Operation of transferring information is described in the above described document of the prior art.

As described in the foregoing, since the conventional nonvolatile RAM memory cell is formed by a combination of the static RAM memory cell and the EEPROM memory cell, the number of transistors required for each memory cell is large, so that the area occupied by a memory cell is increased, which presents a large problem in improving integration. In addition, the number of signal lines is large, so that the structure and control operation of a circuit are complicated.

SUMMARY OF THE INVENTION

A primary object of the present invention is to solve the described problems and to provide a nonvolatile RAM with a novel structure capable of reducing the number of transistors for each memory cell and simplifying a circuit structure so that the area occupied by a cell can be reduced and control operation can be simplified.

The nonvolatile semiconductor memory device according to the present invention comprises a 1 bit memory cell including a first MOS transistor having one conduction terminal connected to a bit line and a control electrode connected to a word line, a memory transistor having one conduction terminal connected to the other conduction terminal of the first MOS transistor, a gate connected to a first control line for transferring signals of first and second and third potentials and a charge storage layer, and a second MOS transistor having one conduction terminal connected to the other conduction terminal of the memory transistor, other conduction terminal coupled to a ground potential and a gate receiving an operating mode designating signal.

The memory cell according to the present invention functions as a single transistor/a single capacitor dynamic random access memory in which the first MOS transistor serves as a transfer gate and the memory transistor serves as a capacitor when the signal of the second potential is applied to the first control signal line and a first operating mode designating signal is applied to a second control signal line so that a second MOS transistor is turned off. On the other hand, it functions as an EEPROM when the signals of the first and third potentials are applied to the first control signal line and a second operating mode designating signal is applied to the second control signal line so that the second transistor is rendered conductive.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
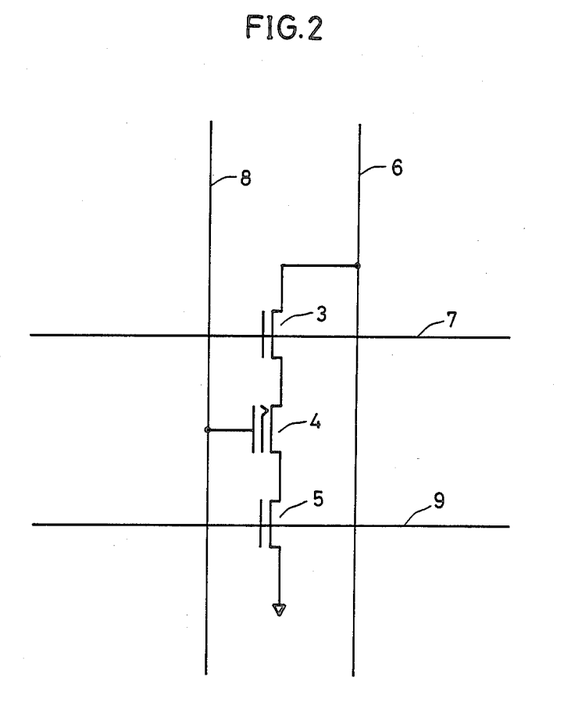
FIG. 2 is a diagram showing an example of a structure of a memory cell in a nonvolatile RAM according to an embodiment of the present invention.

FIG. 2 is a diagram showing a structure of a memory cell in a nonvolatile RAM according to an embodiment of the present invention. In FIG. 2, the memory cell according to the present invention comprises an n channel MOS transistor 3 of an enhancement type having a drain connected to a bit line 6 and a gate connected to a word line 7, a memory transistor 4 of an FLOTOX type having a drain connected to a source of the MOS transistor 3 and a control gate connected to a control gate line 8, and a second MOS transistor 5 having a drain connected to a source of the memory transistor 4, a gate connected to a mode switching signal line 9 and a source connected to a ground potential.

The memory transistor 4 has a floating gate storing charges and transfers charges from the drain to the floating gate or vice versa through a tunnel oxide film in response to the signal potential applied to the control gate line 8 and the bit line 6 when information is written and erased.

Signals of potentials at first, second and third levels, i.e. potentials at "L" and "H" levels and a potential $V_P$ at a level higher than the "H" level are transferred to the control gate line 8. More specifically, in the structure of the memory cell shown in FIG. 2, the mode selecting transistor 5 and the mode switching signal line 9 are added to an FLOTOX type memory cell in the conventional EEPROM. Description is now made on operation.

Information stored in the memory transistor 4 is erased by applying the potential at an "H" level to the mode switching signal line 9 and the high potential $V_P$ to the control gate line 8 and the word line 7, making the bit line 6 be at the ground potential. In this case, the drain of the memory transistor 4 is electrically connected to the bit line 6 through the transfer gate transistor 3 to be the ground potential. The control gate of the memory transistor 4 becomes the high potential $V_P$ level through the control gate line 8. On the other hand, the mode selecting transistor 5 is turned on, so that the source of the memory transistor 4 becomes the ground potential through the transistor 5. In this state, a high voltage is applied to the tunnel oxide film between the floating gate and the drain of the memory transistor 4. Accordingly, electrons are injected from the drain to the floating gate as a tunnel current, so that electrons are stored in the floating gate. As a result, the threshold voltage of the memory transistor 4 is shifted to a higher level, so that the memory transistor 4 becomes an erased state, that is, information "1" is written.

Information "0" is written into the memory transistor 4 by making the potential on the mode switching signal line 9 an "L" level so that the mode selecting transistor 5 is turned off and by applying the high potential $V_P$ to the bit line 6 and the word line 7 and also by applying to the control gate 8 the ground potential. At that time, the drain of the memory transistor 4 is connected to the bit line 6 at the high potential $V_P$ level through the transfer gate transistor 3, and the control gate thereof is connected to the control gate line 8 at the ground potential level. Thus, the high voltage is applied between the drain and the floating gate of the memory transistor 4. Accordingly, electrons flow from the floating gate to the drain through the tunnel oxide film as a tunnel current, so that electrons are emitted from the floating gate. As a result, the threshold voltage of the memory transistor 4 is shifted to a lower level, so that the memory transistor 4 is of a depletion type, that is, information "0" is written.

In operation as an EEPROM, a signal at an "H" level is applied to the mode switching signal line 9 so that the mode selecting transistor 5 is turned on, and the potential at an "L" level which is the ground potential or a predetermined potential below the power supply potential (the voltage which is lower than the threshold voltage when the memory transistor 4 is of an enhancement type, that is, when information "1" is written) is applied to the control gate line 8. In this state, if and when the word line 7 is selected and the potential thereon becomes an "H" level so that the transfer gate transistor 3 is turned on, the drain of the memory transistor 4 is electrically connected to the bit line 6. In this state, when the memory transistor 4 stores information "1", the memory transistor 4 is turned off, so that no current flows through the bit line 6. On the other hand, when information "0" is written into the memory transistor 4, the memory transistor 4 is turned on, so that current flows through the bit line 6. Therefore, information "1" and "0" are read out by detecting the presence or absence of current on the bit line 6.

In operation as s dynamic random access memory (DRAM), the potential at an "L" level is applied to the mode switching signal line 9, and the potential at an "H" level (the potential which is higher than the threshold voltage when the memory transistor 4 is of an enhancement type and the threshold value thereof is high) is applied to the control gate line 8. When the potential at an "H" level is applied to the control gate line 8, the memory transistor 4 is turned on irrespective of information stored therein, so that capacitance is formed between the control gate and the drain of the memory transistor 4. The reason why the memory transistor 4 is made conductive irrespective of information stored therein is to form an inversion layer. Capacitance formed between the control gate and the drain of the memory transistor 4 acts as capacitance for storing information signal charges, so that a DRAM memory cell of a single transistor/a single capacitor type is formed by operating the transfer gate transistor 3 as a transfer gate in the conventional DRAM cell.

From the foregoing, a memory cell capable of operating as a DRAM memory cell and as an EEPROM memory cell can be formed with a simple structure. Information store in a DRAM can be stored at an EEPROM in a nonvolatile manner by suitably forming a peripheral circuit (not shown).

Figure 3:
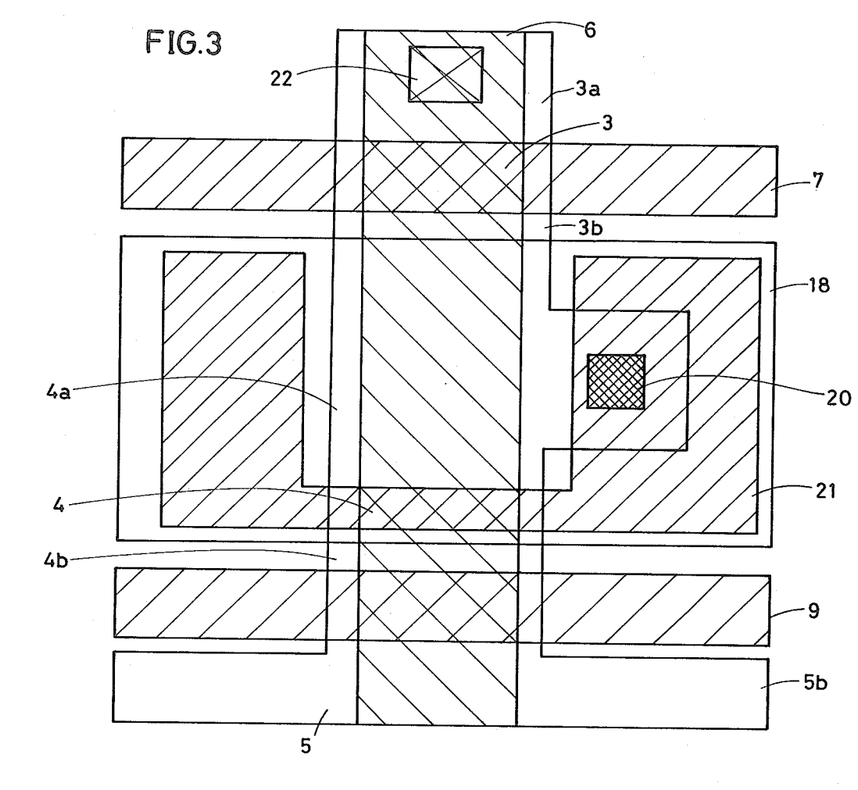
FIG. 3 is a diagram showing a planar layout of the nonvolatile RAM according to an embodiment of the present invention.

FIG. 3 is a diagram showing an example of a planar layout of a nonvolatile RAM according to an embodiment of the present invention. In FIG. 3, the transfer gate transistor 3 has a drain 3a connected to the bit line 6 through a contact hole 22, a gate electrode which is the word line 7 and a source region 3b connected to a drain 4a of the memory transistor 4. The source region 3b of the transfer gate transistor 3 and the drain region 4a of the memory transistor 4 are formed in the identical impurity diffusion region.

The memory transistor 4 comprises a drain region 4a, a floating gate 21 formed in an U shape for storing charges, and a control gate 18 formed on the floating gate 21 through an insulating film. A tunnel oxide film region 20 for transferring electrons as a tunnel current is provided between the drain 4a and the floating gate 21 of the memory transistor 4. In addition, in order to increase capacitance formed at the time of DRAM operation, the control gate 18 is formed in a rectangular shape in the center of the drawing so that it may be largely overlapped with the drain 4a. The mode selecting transistor 5 has a gate which is a part of the mode switching signal line 9 for selecting an operating mode, a drain shared with the source region 4b of the memory transistor 4 and a source region 5b.

Figure 4:
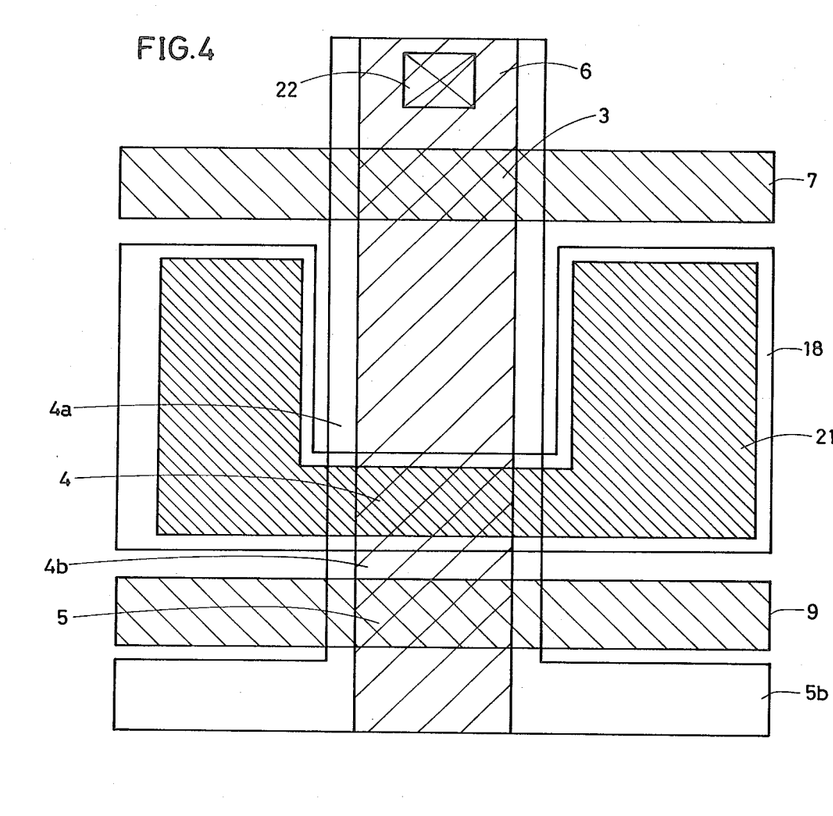
FIG. 4 is a diagram showing another planar layout of the nonvolatile memory cell according to the present invention.

FIG. 4 is a diagram showing a planar layout of a nonvolatile RAM according to another embodiment of the present invention. In the structure shown in FIG. 4, the control gate 18 of the memory transistor 4 has almost the same shape as the floating gate 21 and is not so largely overlapped with the drain 4a. The structure of the other regions is the same as a planar layout shown in FIG. 3, except that the drain region is not provided with a projected region.

Figure 5:
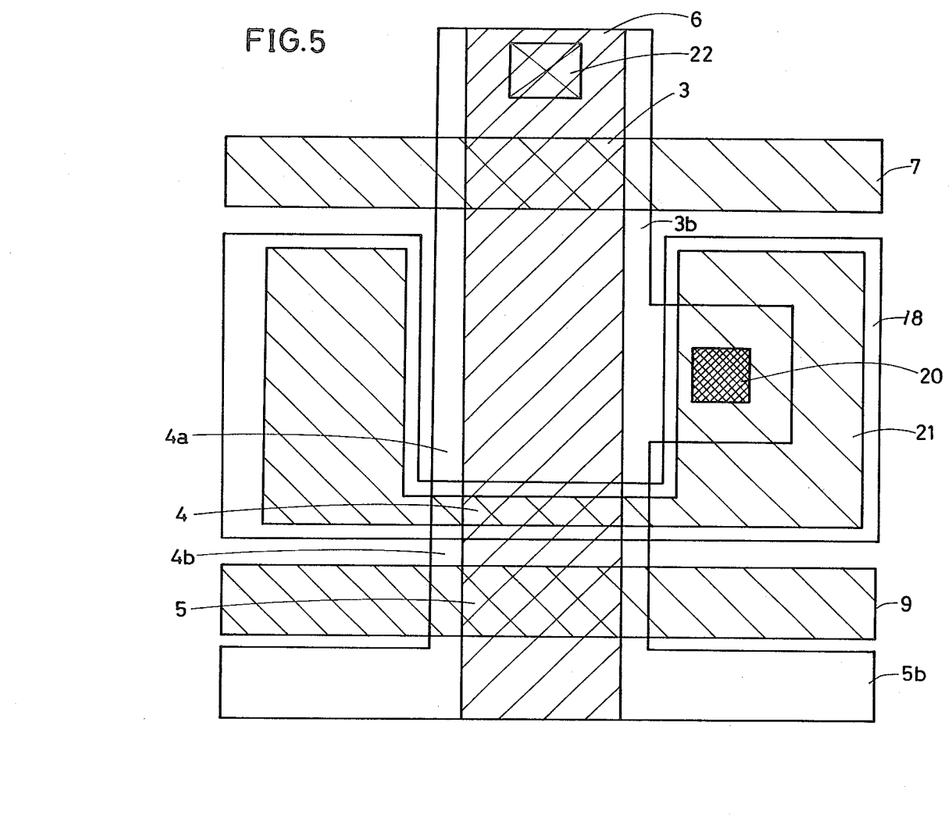
FIG. 5 is a diagram showing still another planar layout of the nonvolatile memory cell according to the present invention.

FIG. 5 is a diagram showing a planar layout of a nonvolatile RAM memory cell according to a third embodiment of the present invention. The regions corresponding to the portions shown in FIG. 3 have the same reference numerals. In the structure shown in FIG. 5, the drain 4a of the memory transistor 4 is provided with a projected region, where electrons are transferred from/to the floating gate 21 through the tunnel oxide film region 20. However, the control gate 18 and the floating gate 21 are formed in almost the same shape.

Figure 6:
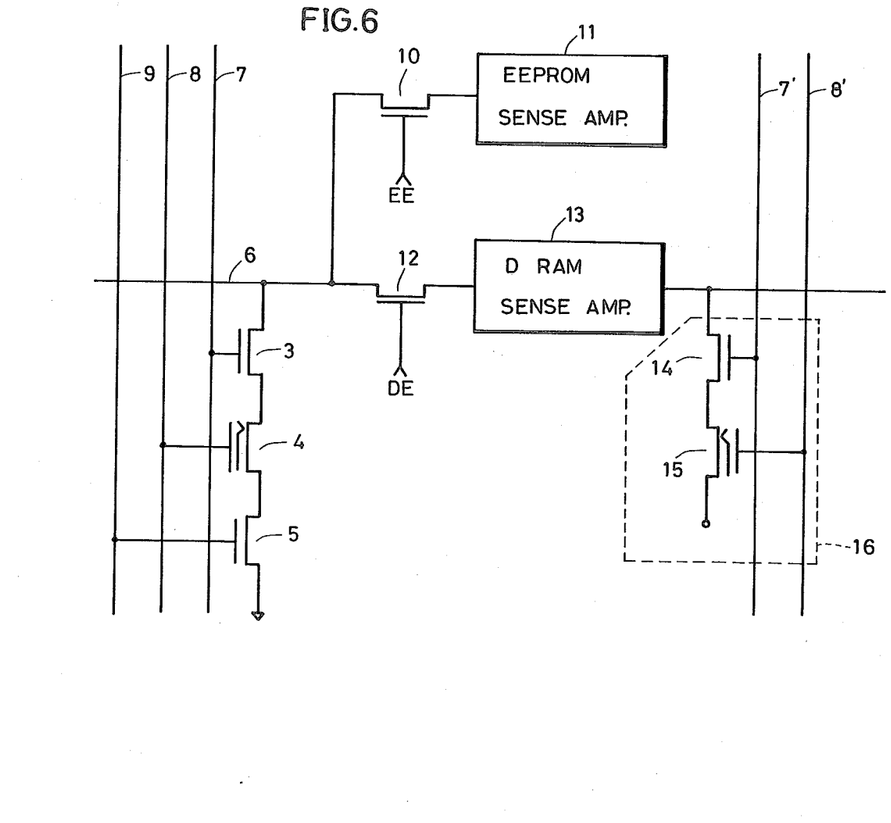
FIG. 6 is a diagram showing a schematic structure of a system for reading out data in the nonvolatile RAM according to the present invention.

FIG. 6 is a diagram showing an example of a structure of a system for reading data in the nonvolatile RAM according to the present invention. In FIG. 6, the bit line 6 is connected to a sense amplifier 11 for an EEPROM through a first transfer gate 10, and to a sense amplifier 13 for a DRAM through a second transfer gate 12. The first transfer gate 10 has a gate receiving a signal EE for operating an EEPROM system. The second transfer gate 12 has a gate receiving a signal DE for operating a DRAM system.

Furthermore, the other side of the sense amplifier 13 for a DRAM is provided with a dummy cell 16 having capacitance of about a half capacitance of a memory cell and applying the reference voltage to the bit line 6 for increasing sensing margin of the sense amplifier 13 at the time of data read-out. The dummy cell 16 comprises an MOS transistor 14 serving as a transfer gate and a memory transistor 15 serving as capacitance. The memory transistor 15 has a source held in an electrically floating state. The MOS transistor 14 has a gate connected to a word line 7', and the memory transistor 15 has a control gate connected to a control gate line 8'.

Description is now made on operation. In operation as an EEPROM, the signal EE is an "H" level and the signal DE is an "L" level. Thus, the bit line 6 is connected to the sense amplifier 11 for an EEPROM through the transfer gate 10, so that a system for reading data out of an EEPROM becomes an active state, while a system for reading data out of a DRAM becomes an inactive state. Operation in reading out data from a memory cell is the same as that described referring to FIG. 2. At that time, the presence or absence of current on the bit line 6 is detected in the sense amplifier 11 for an EEPROM through the transfer gate 10, so that information stored in the memory cell is read out.

On the other hand, in operation as DRAM, the signal EE is an "L" level and the signal DE is an "H" level. Thus, only the sense amplifier 13 for a DRAM is electrically connected to the bit line 6. When a memory cell is selected and the potential on the word line 7 becomes an "H" level, signal charges stored in capacitance of the memory transistor 4 appear on the bit line 6. At that time, signals are applied to the signal lines 7' and 8' similarly to the word line 7 and the control gate line 8, so that the dummy cell 16 is activated. Thus, the reference potential is applied to the bit line, so that the sensing margin of the sense amplifier 13 for a DRAM is increased. The sense amplifier 13 for a DRAM detects change in potential due to signal charges appearing on the bit line 6 through the transfer gate 12, so that information is read out.

Although in the above described embodiment, a memory transistor of an FLOTOX type was used as a memory transistor of an EEPROM, it is not limited thereto. For example, a memory transistor with another structure may be used, in which case the same effect can be obtained.

As described in the foregoing, according to the present invention, since in addition to the conventional EEPROM memory cell, an MOS transistor responsive to an operating mode designating signal for turning on/off is provided between the source of the memory transistor 4 and the ground potential, a memory cell can be obtained which can utilize the memory transistor as capacitance by controlling the signal potential applied to the control gate line, so that it can operate not only as an EEPROM but also as a DRAM with a simple circuit structure without increasing the number of elements.

Although the present invention has been described and illustrated in detail, it is clearly understood that the same is by way of illustration and example only and is not to be taken by way of limitation, the spirit and scope of the present invention being limited only by the the terms of the appended claims.

What is claimed is:

1. A nonvolatile semiconductor memory device having a plurality of memory cells arranged in a matrix manner including rows and columns and each connected to a single row selecting signal line and a single column selecting signal line for storing information, each of said memory cells comprising:
   a first control signal line for transferring signals of potentials at first, second and third levels;
   a second control signal line for transferring operating mode designating signals for designating first and second operating modes of said semiconductor memory device;
   a first metal-oxide-semiconductor field effect transistor having one conduction region connected to said column selecting signal line, a control electrode connected to said row selecting signal line, and other conduction region;
   a memory transistor having one conduction region connected to the other conduction region of said first metal-oxide-semiconductor field effect transistor, a control electrode connected to said first control signal line, a floating gate for storing charges, and other conduction region; and
   a second metal-oxide-semiconductor field effect transistor having one conduction region connected to said other conduction region of said memory transistor, a control electrode connected to said second control signal line, and other conduction region coupled to a ground potential;
   said memory cell operating as a dynamic random access memory cell when said first control signal line transfers said signal of the potential at the second level and said second metal-oxide-semiconductor field effect transistor is turned off in response to the operating mode designating signal applied through said second control signal line; and
   said memory cell operating as an electrically programmable and erasable nonvolatile semiconductor memory cell when said first control signal line transfers said signals of the potentials at the first and third levels.

2. A nonvolatile semiconductor memory device in accordance with claim 1, wherein said memory transistor comprises an electrically programmable and erasable nonvolatile memory transistor of a floating gate tunnel oxide film type.

3. A nonvolatile semiconductor memory device in accordance with claim 2, characterized in that said memory transistor has a control electrode region and one conduction region overlapped with each other through an insulating film.

* * * * *